United States Patent
Wei

(10) Patent No.: US 10,832,783 B1
(45) Date of Patent: Nov. 10, 2020

(54) DATA SENSING DEVICE AND DATA SENSING METHOD THEREOF

(71) Applicant: MACRONIX International Co., Ltd., Hsinchu (TW)

(72) Inventor: Ming-Liang Wei, Kaohsiung (TW)

(73) Assignee: MACRONIX INTERNATIONAL CO., LTD., Hsinchu (TW)

(*) Notice: Subject to any disclaimer, the term of this patent is extended or adjusted under 35 U.S.C. 154(b) by 0 days.

(21) Appl. No.: 16/581,589

(22) Filed: Sep. 24, 2019

(51) Int. Cl.
  G11C 7/00 (2006.01)
  G11C 16/26 (2006.01)
  G06N 3/04 (2006.01)
  G06F 7/42 (2006.01)
  G11C 16/10 (2006.01)

(52) U.S. Cl.
  CPC .......... *G11C 16/26* (2013.01); *G06F 7/42* (2013.01); *G06N 3/04* (2013.01); *G11C 16/10* (2013.01)

(58) Field of Classification Search
  CPC .......... G11C 16/26; G11C 16/10; G06F 7/42; G06N 3/04
  USPC ..................................................... 365/189.15
  See application file for complete search history.

(56) References Cited

U.S. PATENT DOCUMENTS

| 10,528,643 | B1* | 1/2020 | Choi ................. G06F 17/16 |
| 2016/0096272 | A1 | 4/2016 | Smith et al. |
| 2020/0020393 | A1* | 1/2020 | Al-Shamma ........... G11C 16/08 |

FOREIGN PATENT DOCUMENTS

| CN | 109643514 | 4/2019 |
| TW | M319583 | 9/2007 |
| TW | 201617977 | 5/2016 |

OTHER PUBLICATIONS

"Office Action of Taiwan Counterpart Application", dated Apr. 24, 2020, p. 1-p. 5.

* cited by examiner

*Primary Examiner* — Vu A Le
(74) *Attorney, Agent, or Firm* — J.C. Patents

(57) ABSTRACT

A data sensing device and a data sensing method thereof are provided. The data sensing device includes a compensation signal generator, a weighting operator and an arithmetic operator. The compensation signal generator receives a basic input signal and a plurality of reference weighting values, and generates a compensation signal according to the basic input signal and the reference weighting values. The weighting operator has a plurality of memory cells, performs a writing operation on the memory cells according to the weighting values based on address information, and the weighting operator generates an output signal by the memory cells by receiving a plurality of input signals. The arithmetic operator performs an operation on the output signal and the compensation signal to generate a compensated output signal.

14 Claims, 5 Drawing Sheets

DATA SENSING DEVICE AND DATA SENSING METHOD THEREOF

BACKGROUND OF THE INVENTION

1. Field of the Invention

The present invention relates to a data sensing device and a data sensing method thereof, and in particular, to a data sensing device can achieve negative input and suitable for artificial neural network operations and a data sensing method thereof.

2. Description of Related Art

With the evolution of an electronic technology, an artificial intelligence technology has gradually become a mainstream. An artificial neural network is an important way to perform artificial intelligence calculations.

The artificial neural network is subject to a large number of operations. In the conventional technical field, the operations of the artificial neural network are often performed through digital circuits or high-order processors. Such an approach requires relatively high hardware costs and also requires relatively high power to perform operations. Corresponding to this, the conventional technology performs artificial neural network operations through a non-volatile memory, which can effectively reduce the circuit area and reduce the required power consumption.

In the conventional technical field, the transconductance of memory cells in the non-volatile memory can be provided as a weight in the artificial neural network. The operation of the artificial neural network can be implemented by a product of an input signal received by the memory cells and the transconductance of the memory cells.

However, in practical applications, the operation of the artificial neural network often has a negative input signal. On hardware architecture, in order to implement an artificial neural network operation for a negative input signal which needs to illustrate the input signal by subtracting two values (i.e. a first value subtracts a second value). The operation takes the first value and the second value to be the input signals of the artificial neural network, multiplies an output in a second cycle with a negative sign, and adds with an output in a first cycle. An amount of operation of artificial neural network operation the by using above scheme with negative input will be trebled, the difficulty of implementation will be increased, and the circuit cost will be increased.

SUMMARY OF THE INVENTION

The present invention is directed to a data sensing device and a data sensing method, used for implementing an artificial neural network operation for a negative input signal.

The data sensing device of the present invention includes a compensation signal generator, a weighting operator and an arithmetic operator. The compensation signal generator receives a basic input signal and a plurality of reference weighting values, and generates a compensation signal according to the basic input signal and the reference weighting values. The weighting operator includes a plurality of memory cells, performs a writing operation on the memory cells according to the weighting values based on address information, and the weighting operator generates an output signal by the memory cells by receiving a plurality of input signals. The arithmetic operator is coupled to the compensation signal generator and the weighting operator, and performs an operation on the output signal and the compensation signal to generate a compensated output signal.

The data sensing method of the present invention includes: providing a compensation signal generator for receiving a basic input signal and a plurality of reference weighting values, and generating a compensation signal according to the basic input signal and the reference weighting values; providing a weighting operator for performing a writing operation on a plurality of memory cells in the weighting operator according to a plurality of weighting values based on address information, and generating an output signal by the memory cells by receiving a plurality of input signals; and providing an arithmetic operator for performing an operation on the output signal and the compensation signal to generate a compensated output signal.

Based on the above, in the present invention, the compensation signal generator calculates a compensation signal, generates an output signal by calculating an input signal offset to a positive signal, and generates a compensated output signal that may have a negative input signal by performing an operation on the output signal and the compensation signal. Under a simple hardware architecture, an artificial neural network operation having a negative input signal is implemented.

To make the foregoing features and advantages of the present invention more comprehensible, embodiments are described in detail below with reference to the accompanying drawings.

DESCRIPTION OF THE EMBODIMENTS

Figure 1:
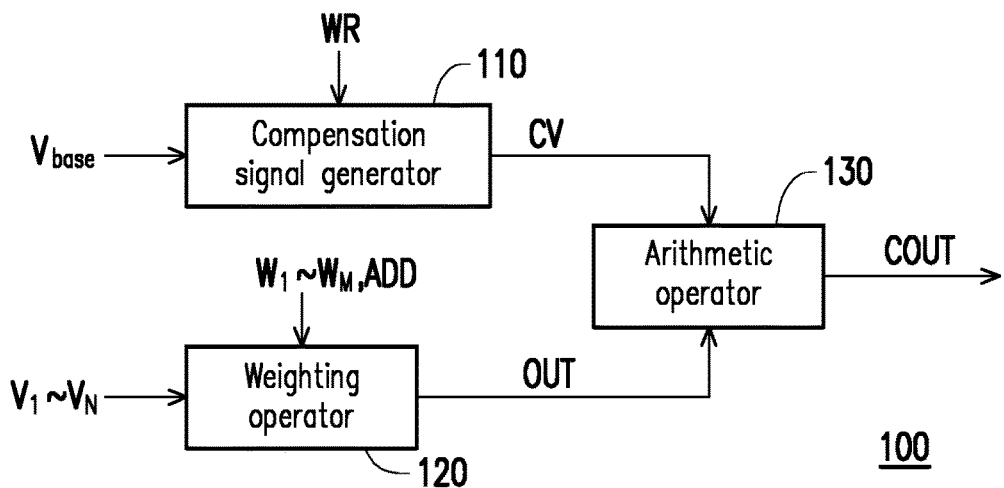
FIG. 1 shows a schematic diagram of a data sensing device according to an embodiment of the present invention.

Referring to FIG. 1, FIG. 1 shows a schematic diagram of a data sensing device according to an embodiment of the present invention. A data sensing device 100 includes a compensation signal generator 110, a weighting operator 120 and an arithmetic operator 130. The compensation signal generator 110 receives a basic input signal $V_{base}$ and a plurality of reference weighting values WR. The compensation signal generator 110 generates a compensation signal CV according to the basic input signal $V_{base}$ and the reference weighting values WR. In detail, the compensation signal generator 110 may calculate a reference weighting sum of the reference weighting values WR and multiply the reference weighting sum by the reference input signal $V_{base}$ to obtain the compensation signal CV. In other embodiments of the present invention, the compensation signal generator 110 may also be a data storage component. The compensation signal CV may be calculated outside the compensation signal generator 110 and stored in the compensation signal generator 110.

On the other hand, in the embodiments of the present invention, the weighting operator 120 receives address information ADD and a plurality of weighting values $W_1$ to $W_M$. The weighting operator 120 may have a plurality of non-volatile memory cells, and the weighting operator 120 may perform a writing operation on the non-volatile memory cells according to the weighting values $W_1$ to $W_M$ based on the address information ADD. The transconductances of the non-volatile memory cells after the completion of the writing operation are respectively set according to the weighting values $W_1$ to $W_M$. For example, the weighting values $W_1$ to $W_M$ may be A times the corresponding transconductances, where A may be any real number. In addition, the weighting operator 120 further receives input signals $V_1$ to $V_N$, applies the input signals $V_1$ to $V_N$ to the non-volatile memory cells respectively, and accordingly generates an output signal OUT. It is to be noted here that after an artificial neural network has a negative input signal, an offset operation may be performed according to the reference input signal $V_{base}$ for all input signals, so that the offset input signals $V_1$ to $V_N$ are all positive signals. In this way, the weighting operator 120 may efficiently perform an artificial neural network operation according to the input signals $V_1$ to $V_N$ and generate the output signal OUT. It is to be noted here that a sum of the weighting values $W_1$ to $W_M$ is equal to a sum of the reference weighting values WR.

On the other hand, the arithmetic operator 130 is coupled to the compensation signal generator 110 and the weighting operator 120, and performs an arithmetic operation on the output signal OUT and the compensation signal CV to generate a compensated output signal COUT. The arithmetic operator 130 may subtract the compensation signal CV from the output signal OUT to generate the compensated output signal COUT. In this way, the data sensing device 100 may generate an output signal (i.e., the compensated output signal COUT) that actually corresponds to the artificial neural network operation performed by the negative input signal.

Figure 2:
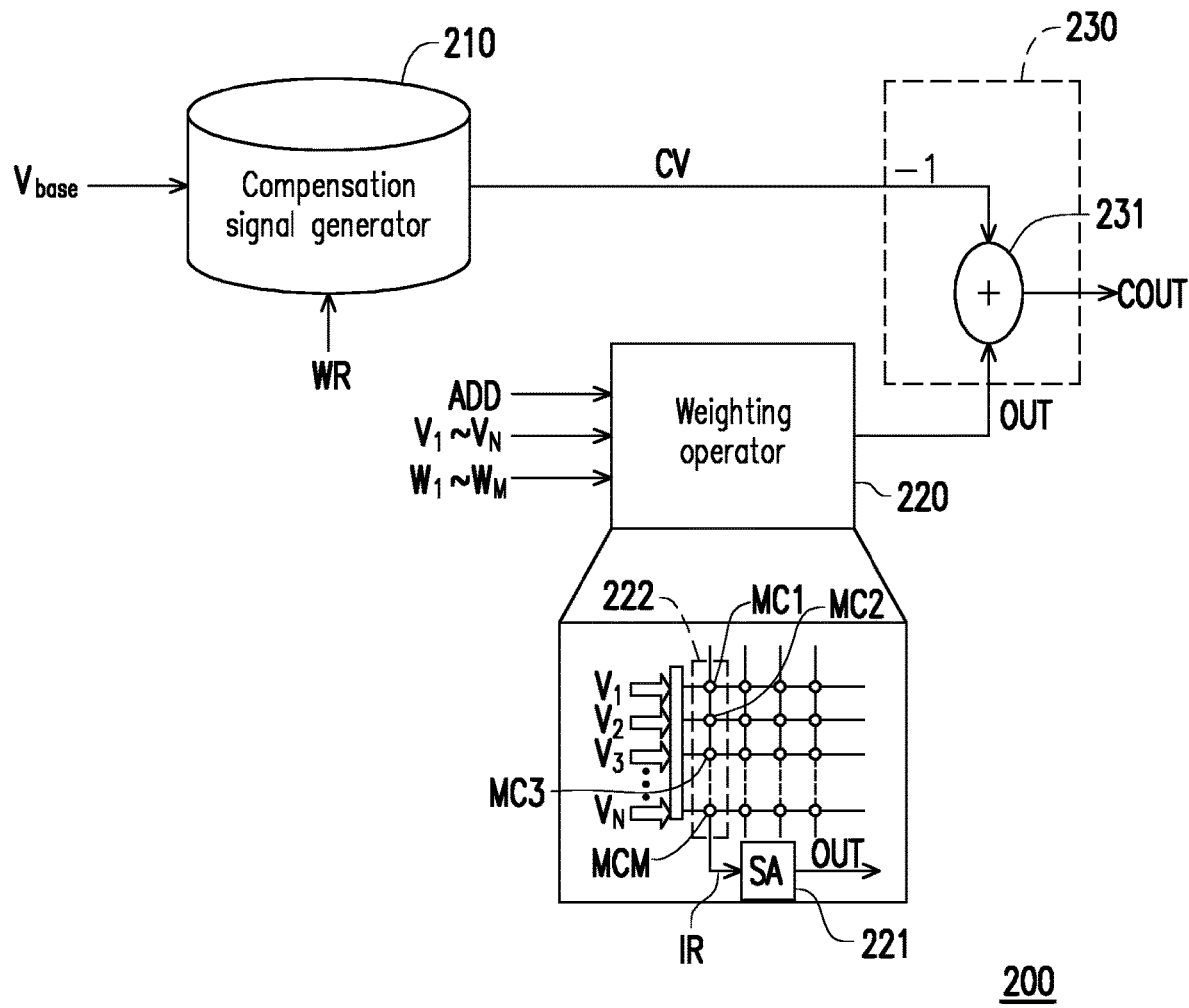
FIG. 2 shows a schematic diagram of an implementation of a data sensing device according to an embodiment of the present invention.

Referring to FIG. 2, FIG. 2 shows a schematic diagram of an implementation of a data sensing device according to an embodiment of the present invention. A data sensing device 200 includes a compensation signal generator 210, a weighting operator 220 and an arithmetic operator 230. In the present implementation, the compensation signal generator 210 receives a basic input signal $V_{base}$ and reference weighting values WR, and generates a compensation signal CV by multiplying the basic input signal $V_{base}$ by a sum of the reference weighting values WR. In other implementations of the present invention, the compensation signal generator 210 may be a data storage component. The compensation signal CV may be calculated outside the compensation signal generator 210 and stored in the compensation signal generator 210.

On the other hand, in the embodiments of the present invention, the weighting operator 220 has a plurality of memory cells MC1 to MCM. The weighting operator 220 performs a writing operation on the memory cells MC1 to MCM according to a plurality of weighting values $W_1$ to $W_M$ based on the address information ADD. Moreover, the weighting operator 220 receives a plurality of input signals $V_1$ to $V_N$ respectively by the memory cells MC1 to MCM to generate an output signal OUT. The memory cells MC1 to MCM may be constructed on the same memory string 222. When the writing operation of the weighting values $W_1$ to $W_M$ is performed for the memory cells MC1 to MCM, the transconductances of the memory cells corresponding to the weighting values $W_1$ to $W_M$ may be first calculated, and then the writing operation is performed on the memory cells MC1 to MCM respectively according to the calculated transconductances.

The weighting operator 220 further includes a sensing amplifier 221. The sensing amplifier 221 is coupled to the memory string 222, and receives a read current IR generated by the memory string 222 according to the received input signals $V_1$ to $V_N$. The sensing amplifier 221 compares the read current IR with a plurality of reference currents to generate an output signal OUT.

It is worth mentioning that the number of the memory cells in the weighting operator 220 may be set according to the number of the weighting values $W_1$ to $W_M$ in an artificial neural network, and is not particularly limited. In addition, the memory cells MC1 to MCM in the present implementation may be flash memory cells.

The operator 230 is coupled to the compensation signal generator 210 and the weighting operator 220. The operator 230 receives the compensation signal CV generated by the compensation signal generator 210, receives the output signal OUT generated by the weighting operator 220, and performs an arithmetic operation on the output signal OUT and the compensation signal CV to generate a compensated output signal COUT. The operator 230 may include a adder 231. The adder 231 may be used for subtracting the compensation signal CV from the output signal OUT to generate the compensated output signal COUT.

Figure 3:
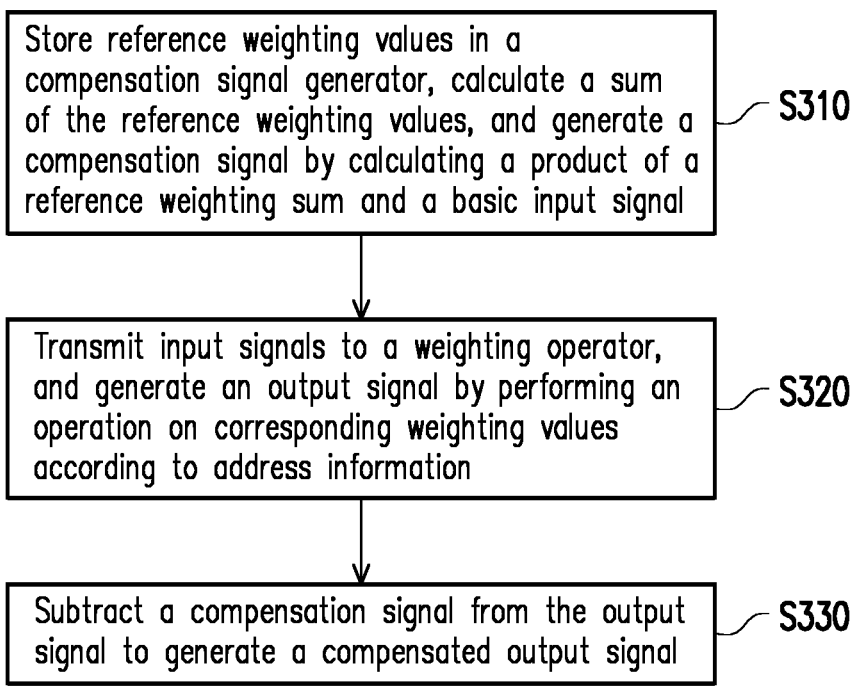
FIG. 3 shows an action flowchart of the implementation in FIG. 2 of the present invention.

Referring to FIG. 2 and FIG. 3 simultaneously, FIG. 3 shows an operation flowchart of the implementation in FIG. 2 of the present invention. In step S310, reference weighting values WR may be stored in the compensation signal generator 210, a sum of the reference weighting values WR (reference weighting sum) is calculated, and a compensation signal is generated by calculating a product of the reference weighting sum and a basic input signal. In addition, in step S320, input signals $V_1$ to $V_N$ are transmitted to the weighting operator 220, and an output signal OUT is generated by performing an operation on the input signals $V_1$ to $V_N$ and the corresponding weighting values according to address information respectively. In step S330, a compensation signal CV is subtracted from the output signal OUT to generate a compensated output signal COUT.

Figure 4:
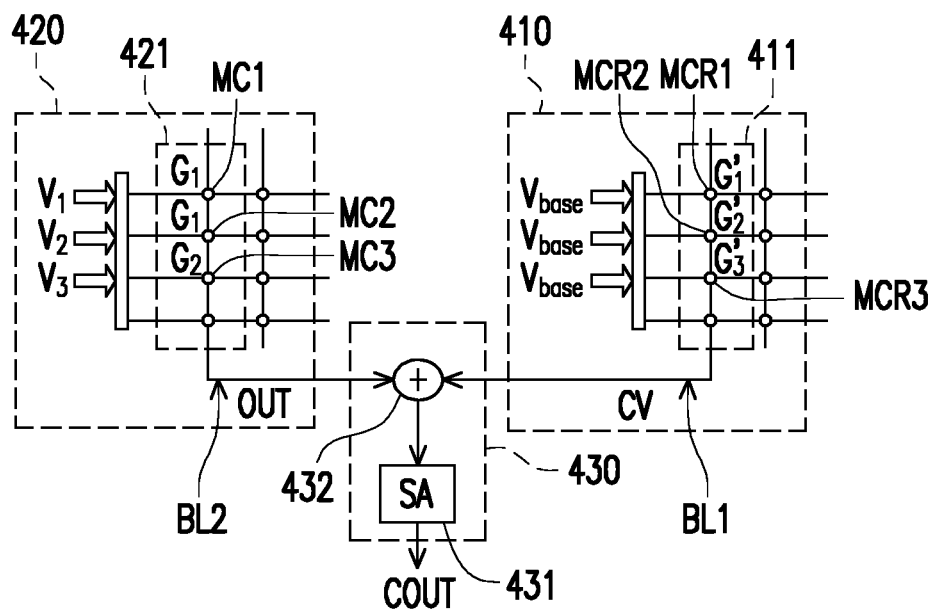
FIG. 4 shows a schematic diagram of another implementation of a data sensing device according to an embodiment of the present invention.

Then, referring to FIG. 4, FIG. 4 shows a schematic diagram of an implementation of a data sensing device according to an embodiment of the present invention. A data sensing device 400 includes a compensation signal generator 410, a weighting operator 420 and an arithmetic operator 430. The compensation signal generator 410 includes a memory string 411 composed of a plurality of reference memory cells MCR1 to MCR3. The compensation signal generator 410 performs a writing operation for the reference memory cells MCR1 to MCR3 according to a plurality of reference weights, and the reference memory cells MCR1 to MCR3 provide a plurality of reference transconductances $G'_1$, $G'_2$ and $G'_3$ respectively. Moreover, the memory string 411 of the compensation signal generator 410 receives a basic input signal $V_{base}$, and a read current is provided as a compensation signal CV through a bit line BL1 of the memory string 411.

On the other hand, the weighting operator 420 has a memory string 421 composed of a plurality of memory cells MC1 to MC3. The weighting operator 420 performs a writing operation on the memory cells MC1 to MC3 according to a plurality of weighting values respectively, such that the memory cells MC1 to MC3 provide a plurality of transconductances $G_1$, $G_2$ and $G_3$ respectively. It is worth mentioning that a sum of the reference transconductances $G'_1$, $G'_2$ and $G'_3$ is equal to a sum of the transconductances $G_1$, $G_2$ and $G_3$. In addition, the memory cells MC1 to MC3 receive input signals $V_1$, $V_2$ and $V_3$ respectively, and a read current is provided as an output signal OUT through a bit line BL2 of the memory string 421.

The arithmetic operator 430 includes a sensing amplifier (SA) 431 and a current subtractor 432. The current subtractor 432 receives the compensation signal CV and the output signal OUT, and subtracts the compensation signal CV from the output signal OUT (by multiplying the compensation signal CV with −1 and adding the output signal OUT). The sensing amplifier 431 is coupled to the current subtractor 432 and compares a subtraction result generated by the current subtractor 432 with a plurality of preset reference currents to sense a compensated output signal COUT.

In the present implementation, the memory strings 411 and 421 may be disposed at different locations, but share the same address information. That is, the memory strings 411 and 421 may be simultaneously written, and may be simultaneously read to simultaneously provide a read current.

Figure 5:
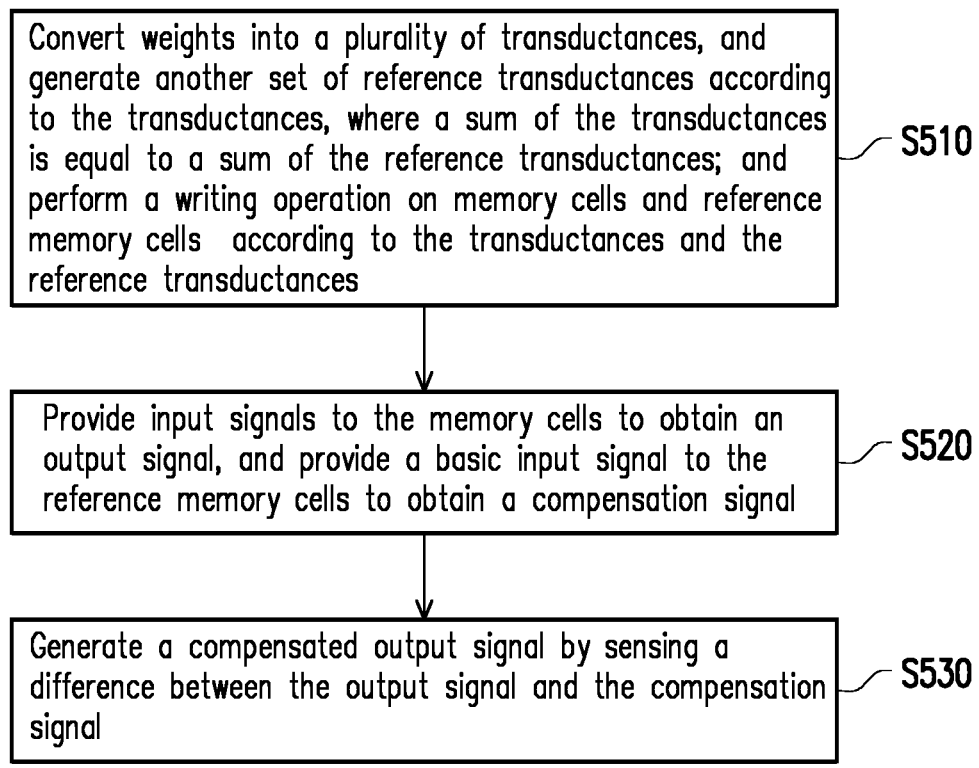
FIG. 5 shows an operation flowchart of the implementation in FIG. 4 of the present invention.

Referring to FIG. 4 and FIG. 5 simultaneously, FIG. 5 shows an operation flowchart of the implementation in FIG. 4 of the present invention. In step S510, a plurality of weights is converted into a plurality of transconductances $G_1$, $G_2$ and $G_3$ respectively, and another set of reference transconductances $G'_1$, $G'_2$ and $G'_3$ is generated according to the transconductances. A sum of the transconductances $G_1$, $G_2$ and $G_3$ is equal to a sum of the reference transconductances $G'_1$, $G'_2$ and $G'_3$. Further, a writing operation is performed for the memory cells MC1 to MC3 and the reference memory cells MCR1 to MCR3 according to the transconductances $G_1$, $G_2$ and $G_3$ and the reference transconductances $G'_1$, $G'_2$ and $G'_3$ respectively. In addition, in step S520, input signals $V_1$ to $V_3$ are provided to the memory cells MC1 to MC3 to obtain an output signal OUT, and a basic input signal $V_{base}$ is provided to the reference memory cells MCR1 to MCR3 to obtain a compensation signal CV. In step S530, a compensated output signal COUT is generated by sensing a difference between the output signal OUT and the compensation signal CV.

Figure 6:
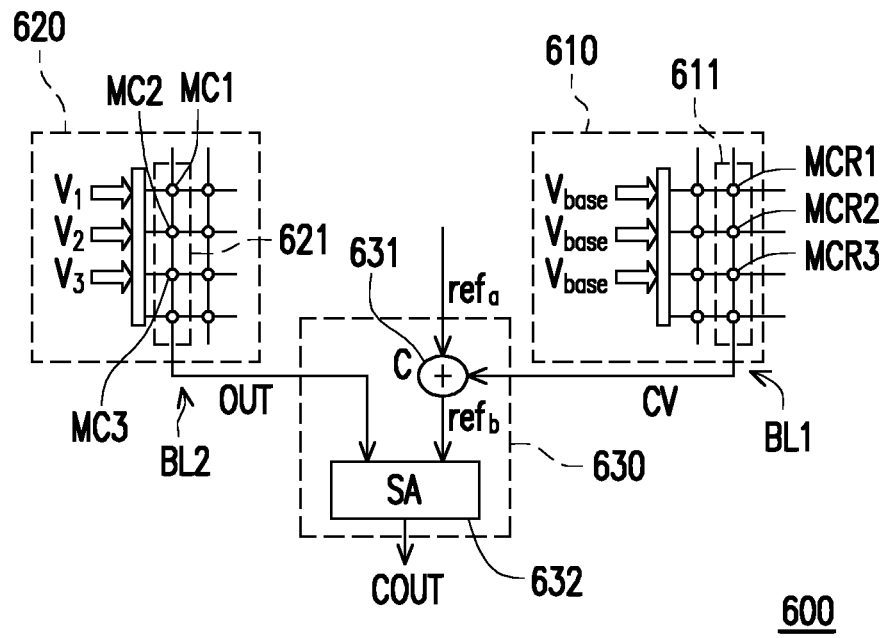
FIG. 6 shows a schematic diagram of another implementation of a data sensing device according to an embodiment of the present invention.

Then, referring to FIG. 6, FIG. 6 shows a schematic diagram of an implementation of a data sensing device according to an embodiment of the present invention. A data sensing device 600 includes a compensation signal generator 610, a weighting operator 620 and an arithmetic operator 630. The compensation signal generator 610 includes a memory string 611 composed of a plurality of reference memory cells MCR1 to MCR3. The compensation signal generator 610 performs a writing operation for the reference memory cells MCR1 to MCR3 according to a plurality of reference weights, and the reference memory cells MCR1 to MCR3 provide a plurality of reference transconductances respectively. Moreover, the memory string 611 of the compensation signal generator 610 receives a basic input signal $V_{base}$, and a read current is provided as a compensation signal CV through a bit line BL1 of the memory string 611.

On the other hand, the weighting operator 620 has a memory string 621 composed of a plurality of memory cells MC1 to MC3. The weighting operator 620 performs a writing operation on the memory cells MC1 to MC3 according to a plurality of weighting values respectively, such that the memory cells MC1 to MC3 provide a plurality of transconductances respectively. It is worth mentioning that a sum of the reference transconductances is equal to a sum of the transconductances. In addition, the memory cells MC1 to MC3 receive input signals $V_1$, $V_2$ and $V_3$ respectively, and a read current is provided as an output signal OUT through a bit line BL2 of the memory string 621.

In the present embodiment, the memory strings 611 and 621 may correspond to the same word line and respectively correspond to different bit lines BL1 and BL2.

In the present implementation, the arithmetic operator 630 includes a current adder 631 and a sensing amplifier 632. The current adder 631 receives a compensation signal CV and a plurality of reference currents $ref_a$, and sums the reference currents $ref_a$ and the compensation signal CV to generate a plurality of compensation reference currents $ref_b$. The current adder 631 provides the compensation reference currents $ref_b$ to the sensing amplifier 632. The sensing amplifier 632 further receives an output signal OUT and generates a compensated output signal COUT by comparing the output signal OUT with the compensation reference currents $ref_b$.

Figure 7:
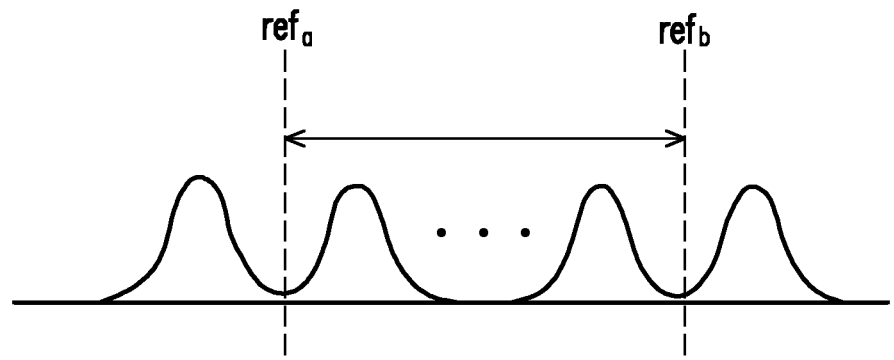
FIG. 7 shows a schematic diagram of an offset operation of a reference current according to an embodiment of the present invention.

Referring to a schematic diagram of an offset operation of a reference current according to an embodiment of the present invention shown in FIG. 7, in the implementation of FIG. 6, the arithmetic operator 630 generates the compensation reference currents $ref_b$ by offsetting the reference currents $ref_a$ using the sensing amplifier 632 as a sensing basis, and a correct compensated output signal COUT may also be effectively generated by comparing the output signal OUT with the compensation reference currents $ref_b$.

Figure 8:
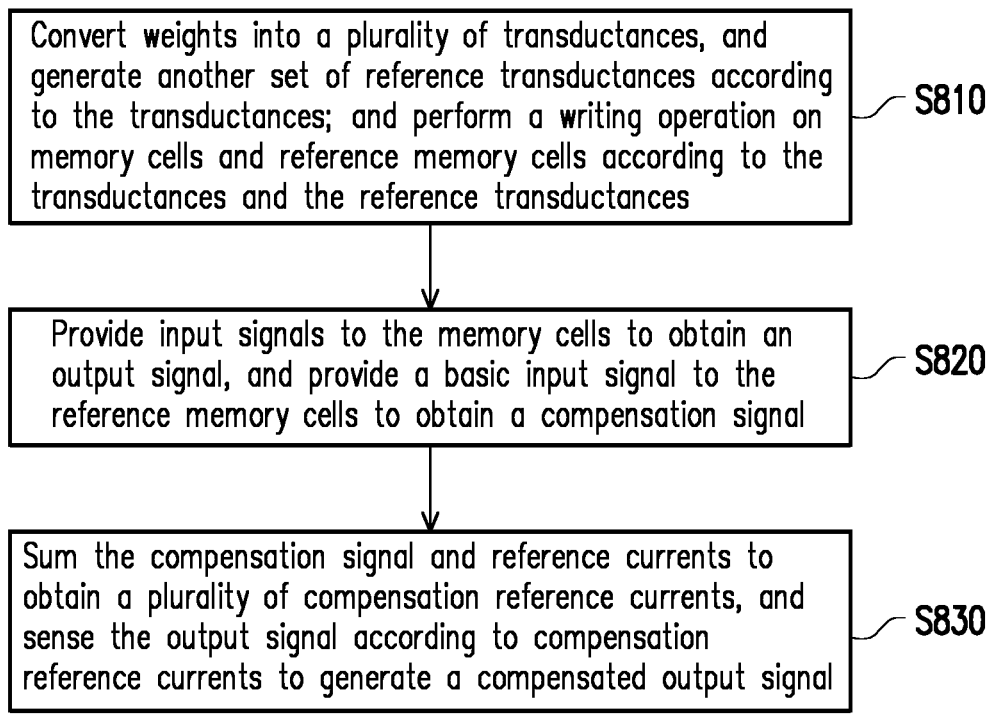
FIG. 8 shows an action flowchart of the implementation in FIG. 6 of the present invention.

Referring to FIG. 6 and FIG. 8 simultaneously, FIG. 8 shows an operation flowchart of the implementation in FIG. 6 of the present invention. In step S810, a plurality of weights is converted into a plurality of transconductances respectively, and another set of reference transconductances is generated according to the transconductances. A sum of the transconductances is equal to a sum of the reference transconductances. Further, a writing operation is performed for the memory cells MC1 to MC3 and the reference memory cells MCR1 to MCR3 according to the transconductances and the reference transconductances respectively. In addition, in step S820, input signals $V_1$ to $V_3$ are provided to the memory cells MC1 to MC3 to obtain an output signal OUT, and a basic input signal $V_{base}$ is provided to the reference memory cells MCR1 to MCR3 to obtain a compensation signal CV. In step S830, the compensation signal CV and the reference currents $ref_a$ are summed to obtain a plurality of compensation reference currents $ref_b$, and the output signal OUT is sensed according to the compensation reference currents $ref_b$ to generate a compensated output signal COUT.

Figure 9:
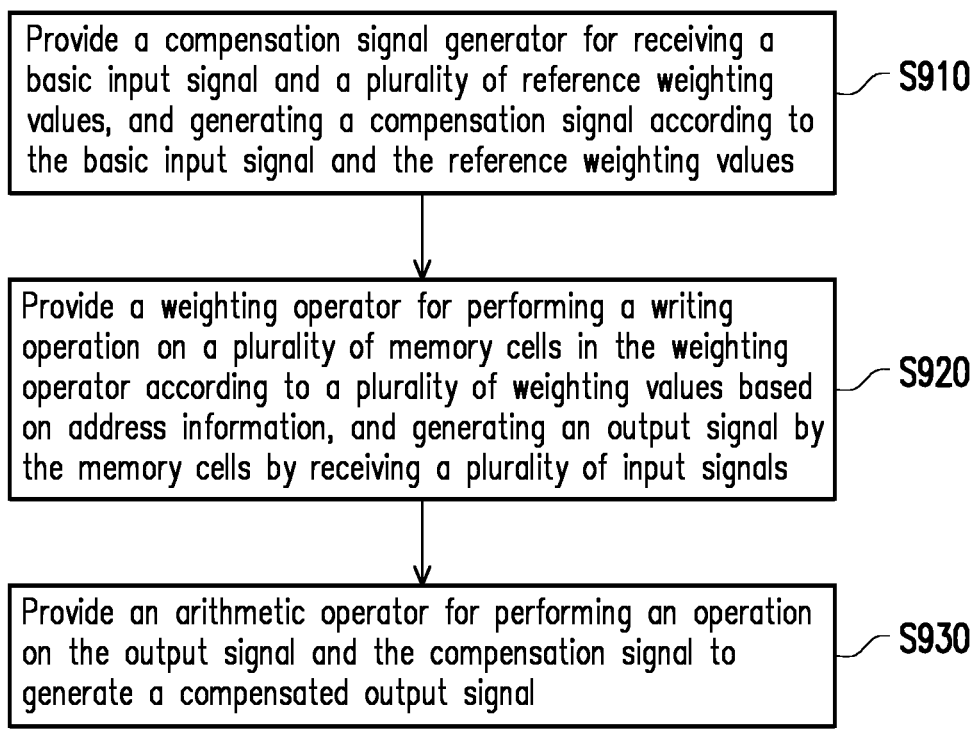
FIG. 9 shows a flowchart of a data sensing method according to an embodiment of the present invention.

Referring to FIG. 9, FIG. 9 shows a flowchart of a data sensing method according to an embodiment of the present invention. In step S910, a compensation signal generator is provided for receiving a basic input signal and a plurality of reference weighting values, and generating a compensation signal according to the basic input signal and the reference weighting values. In step S920, a weighting operator is provided for performing a writing operation on a plurality of memory cells in the weighting operator according to a plurality of weighting values based on address information, and generating an output signal by the memory cells by receiving a plurality of input signals. In step S930, an arithmetic operator is provided for performing an operation on the output signal and the compensation signal to generate a compensated output signal.

The details of implementation of the above steps have been described in detail in the foregoing embodiments and implementations, and will not be further described herein.

In summary, in the present invention, the compensation signal generator is provided to generate a compensation signal according to a basic input signal and a plurality of reference weighting values, and an arithmetic operation is performed on an operation result (output signal) about an artificial neural operation generated by the weighting operator and a reference signal to generate a compensated output signal. Since the compensated signal is independent from the input signal. The compensated signal can be calculated out in advance. In a real implement, comparing with prior art, half amount of operation can be saved. Besides, in a situation that same weighting values are operation by weighting operators, the weighting operators can be shared. In this way, presented invention can be used to complete an operation of an artificial neural network having a negative input signal by lower amount of operation.

Although the present invention has been disclosed above through the embodiments, the embodiments are not intended to limit the present invention. A person of ordinary skill in the art can make some alterations and modifications without departing from the spirit and scope of the present invention. Therefore, the scope of protection of the present invention is defined by the scope of the appended claims.

What is claimed is:

1. A data sensing device, coupled to a memory array, comprising:
   a compensation signal generator, receiving a basic input signal and a plurality of reference weighting values, and generating a compensation signal according to the basic input signal and the reference weighting values;
   a weighting operator, comprising a plurality of memory cells, performing a writing operation on the memory cells according to a plurality of weighting values based on address information, and generating an output signal by the memory cells by receiving a plurality of input signals; and
   an arithmetic operator, coupled to the compensation signal generator and the weighting operator, and performing an operation on the output signal and the compensation signal to generate a compensated output signal.

2. The data sensing device according to claim 1, wherein the compensation signal generator calculates a reference weighting sum of the reference weighting values, and multiplies the reference weighting sum by the basic input signal to obtain the compensation signal.

3. The data sensing device according to claim 1, wherein the weighting operator receives the input signals by the memory cells respectively and generates a read current, and the weighting operator further generates the output signal by sensing the read current.

4. The data sensing device according to claim 3, wherein the weighting operator further comprises a sensing amplifier, which generates the output signal by comparing the read current with a plurality of reference currents.

5. The data sensing device according to claim 1, wherein the memory cells are non-volatile memory cells.

6. The data sensing device according to claim 1, wherein the memory cells provide a plurality of transconductances respectively according to the corresponding weighting values.

7. The data sensing device according to claim 1, wherein the compensation signal generator comprises a plurality of reference memory cells, the compensation signal generator performs a writing operation on the reference memory cells according to the reference weighting values based on the address information, and the compensation signal generator generates the compensation signal by the reference memory cells by receiving the reference input signal,
   a sum of the reference weighting values being equal to a sum of the weighting values.

8. The data sensing device according to claim 7, wherein the arithmetic operator comprises:
   a current subtractor, coupled to the compensation signal generator and the weighting operator, and subtracting the compensation signal from the output signal to generate a subtraction result; and
   a sensing amplifier, coupled to the current subtractor, and comparing the subtraction result with a plurality of reference currents to generate the compensated output signal.

9. The data sensing device according to claim 7, wherein the arithmetic operator comprises:
   a current adder, coupled to the compensation signal generator, and summing the compensation signal and a plurality of reference currents to generate a plurality of compensation reference currents; and
   a sensing amplifier, coupled to the current adder, and comparing the output signal with the compensation reference currents to generate the compensated output signal.

10. The data sensing device according to claim 7, wherein the reference memory cells are non-volatile memory cells.

11. A data sensing method, comprising:
    providing a compensation signal generator for receiving a basic input signal and a plurality of reference weighting values, and generating a compensation signal according to the basic input signal and the reference weighting values;
    providing a weighting operator for performing a writing operation on a plurality of memory cells in the weighting operator according to a plurality of weighting values based on address information, and generating an output signal by the memory cells by receiving a plurality of input signals; and
    providing an arithmetic operator for performing an operation on the output signal and the compensation signal to generate a compensated output signal.

12. The data sensing method according to claim 11, wherein the step of generating the compensation signal according to the basic input signal and the reference weighting values comprises:
    calculating a reference weighting sum of the reference weighting values; and
    multiplying the reference weighting sum by the reference input signal to obtain the compensation signal.

13. The data sensing method according to claim 11, wherein the step of generating the output signal by the memory cells by receiving the input signals comprises:
    generating a read current by the memory cells by receiving the input signals respectively; and
    generating the output signal by sensing the read current.

14. The data sensing method according to claim 11, wherein the step of providing the compensation signal generator for receiving the basic input signal and a plurality of weighting values and generating the compensation signal according to the basic input signal and the reference weighting values comprises:

setting a plurality of reference memory cells in the compensation signal generator;

performing a writing operation on the reference memory cells according to the reference weighting values based on the address information; and generating the compensation signal by the reference memory cells by receiving the reference input signal, a sum of the reference weighting values being equal to a sum of the weighting values.

* * * * *